United States Patent
Hung et al.

(10) Patent No.: US 10,020,777 B2
(45) Date of Patent: Jul. 10, 2018

(54) VOLTAGE CONTROLLED OSCILLATOR AND CONTROL METHOD THEREOF

(71) Applicant: MEDIATEK INC., Hsin-Chu (TW)

(72) Inventors: Chao-Ching Hung, Changhua County (TW); Po-Chun Huang, Yilan County (TW); Yu-Li Hsueh, New Taipei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/239,818

(22) Filed: Aug. 17, 2016

(65) Prior Publication Data

US 2017/0117849 A1    Apr. 27, 2017

Related U.S. Application Data (60) Provisional application No. 62/244,751, filed on Oct. 22, 2015.

(51) Int. Cl.
| | | |
|---|---|---|
| H03B 5/08 | (2006.01) | |
| H03B 5/12 | (2006.01) | |
| H03B 5/06 | (2006.01) | |
| H03L 5/00 | (2006.01) | |
| H03L 7/099 | (2006.01) | |
| H03B 5/10 | (2006.01) | |
| H03B 1/00 | (2006.01) | |

(52) U.S. Cl.
CPC ............ *H03B 5/1234* (2013.01); *H03B 1/00* (2013.01); *H03B 5/06* (2013.01); *H03B 5/10* (2013.01); *H03B 5/1212* (2013.01); *H03L 5/00* (2013.01); *H03L 7/099* (2013.01)

(58) Field of Classification Search
CPC ...... H03B 5/1228; H03B 5/1212; H03B 5/06; H03B 5/1234; H03B 1/00; H03B 5/10; H03L 7/099; H03L 5/00
USPC ............ 331/167, 117 R, 117 FE, 185, 177 V
See application file for complete search history.

(56) References Cited

U.S. PATENT DOCUMENTS

| | | | |
|---|---|---|---|
| 7,961,057 B2 * | 6/2011 | Ong ........................ | H03L 7/099 331/16 |
| 9,083,349 B1 * | 7/2015 | Townsend ................. | H03L 5/00 |
| 2004/0085144 A1 * | 5/2004 | Wu ...................... | H03B 5/1228 331/117 R |

OTHER PUBLICATIONS

Wei Deng, "Class-C VCO With Amplitude Feedback Loop for Robust Start-Up and Enhanced Oscillation Swing", IEEE Journal of Solid-State Circuits, vol. 48, No. 2, Feb. 2013.

\* cited by examiner

*Primary Examiner* — Arnold Kinkead
(74) *Attorney, Agent, or Firm* — Winston Hsu (57) ABSTRACT

A voltage-controlled oscillator for generating oscillation signals at two output terminals includes an inductor coupled between the two output terminals, a capacitor coupled between the two output terminals, two P-type transistors, coupled between a supply voltage and the two output terminals, two N-type transistors coupled between a ground voltage and the two output terminals, and a control circuit. The control circuit is coupled to the inductor, and is arranged to control a current flowing through the two P-type transistors and the inductor by controlling a voltage of the inductor.

18 Claims, 7 Drawing Sheets

VOLTAGE CONTROLLED OSCILLATOR AND CONTROL METHOD THEREOF

CROSS REFERENCE TO RELATED APPLICATIONS

This application claims the priority of U.S. Provisional Application No. 62/244,751, filed on Oct. 22, 2015, which is included herein by reference in its entirety.

BACKGROUND

Recently, a PN-type voltage controlled oscillator (VCO) is widely used because of the low power consumption. However, when the PN-type VCO is applied in a low-voltage application, for example a supply voltage is 1.15V, transistors within the PN-type VCO may operate in a triode region, thereby the power consumption may be increased or the VCO may fail to obtain a stable oscillation. For example, when the PN-type VCO is in a worst corner, a threshold voltage (Vth) of NMOS and PMOS within the PN-type VCO may be up to 0.6V that is greater than a common voltage of the PN-type voltage controlled oscillator (e.g. 1.15V/2=0.575V), causing the NMOS and PMOS operate in the barely-on region. To solve this worst corner problem, one solution is to increase sizes of the NMOS and PMOS to increase the transconductance, however, the larger size NMOS and PMOS within the PN-type VCO may cause a larger power consumption when the PN-type VCO is in a better corner (the threshold voltage (Vth) may be 0.3V-04V).

Therefore, how to design a VCO to always function well with lower power consumption no matter in the worst corner or the better corner is an important topic.

SUMMARY

It is therefore an objective of the present invention to provide a voltage controlled oscillator, which operates as a P-type VCO in a start-up stage, and operates as the PN-type VCO in a normal stage, to solve the above-mentioned problems.

According to one embodiment of the present invention, a voltage-controlled oscillator for generating oscillation signals at two output terminals comprises an inductor coupled between the two output terminals, a capacitor coupled between the two output terminals, two P-type transistors, coupled between a supply voltage and the two output terminals, two N-type transistors coupled between a ground voltage and the two output terminals, and a control circuit. The control circuit is coupled to the inductor, and is arranged to control a current flowing through the two P-type transistors and the inductor by controlling a voltage of the inductor.

According to another embodiment of the present invention, a voltage-controlled oscillator for generating oscillation signals at two output terminals comprises an inductor coupled between the two output terminals, a capacitor coupled between the two output terminals, two P-type transistors, coupled between a supply voltage and the two output terminals, two N-type transistors coupled between a ground voltage and the two output terminals, and a control circuit. The control circuit is coupled to the inductor, and is arranged or turning on or off the two N-type transistors.

According to another embodiment of the present invention, a method for controlling a voltage controlled oscillator comprises: when the voltage-controlled oscillator is in a start-up stage, controlling the voltage controlled oscillator to operate as a P-type voltage-controlled oscillator; and when the voltage-controlled oscillator is in a normal stage following the start-up stage, controlling the voltage controlled oscillator to operate as a PN-type voltage-controlled oscillator.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
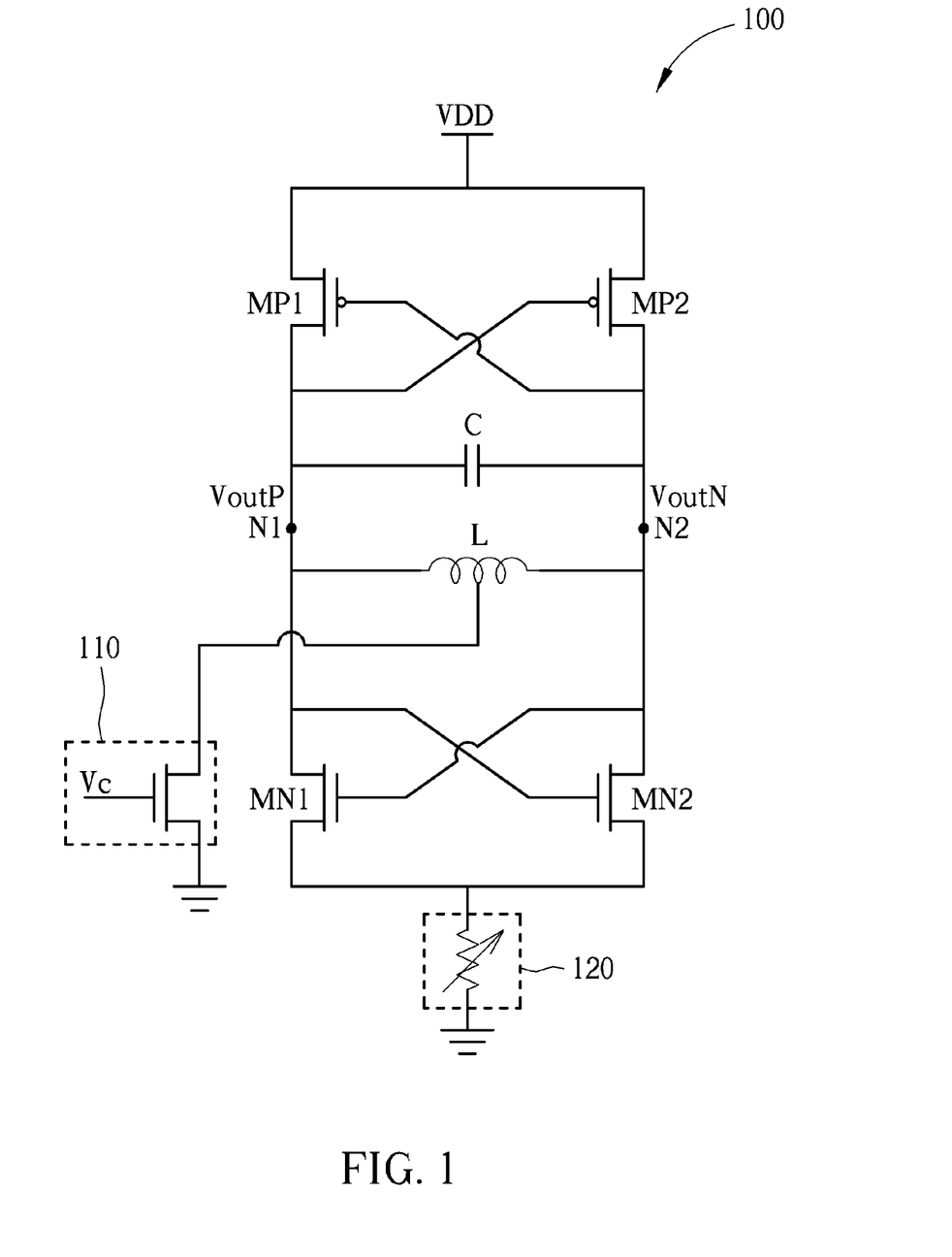
FIG. 1 is a diagram illustrating a VCO according to one embodiment of the present invention.

Please refer to FIG. 1, which is a diagram illustrating a VCO 100 according to one embodiment of the present invention. As shown in FIG. 1, the VCO 100 is a PN-type VCO, and comprises an inductor L, a capacitor C, two PMOSs MP1 and MP2, two NMOSs MN1 and MN2, a control circuit 110 and a variable current source 120. In this embodiment, the inductor and the capacitor C are connected parallel to form a oscillation circuit, the PMOSs MP1 and MP2 are coupled between a supply voltage VDD and two output terminals N1 and N2, the NMOSs MN1 and MN2 are coupled between the output terminals N1 and N2 and the variable current source 120, the control circuit 110 coupled between the inductor L and a ground voltage, and the variable current source 120 is coupled between the NMOSs MN1 and MN2 and the ground voltage. In this embodiment, the capacitor C may comprise two sub-capacitors, and a terminal between the two sub-capacitors serves as an input terminal of the VCO 100, and the VCO 100 receives a control voltage at the input terminal to generate two oscillation signals VoutP and VoutN at the output terminals N1 and N2.

In the embodiment shown in FIG. 1, the control circuit 110 is implemented by using an NMOS, and the control circuit 110 is arranged to selectively connect the ground voltage to the inductor L (e.g. a center tap of the inductor L) according to a control signal Vc. However, it's not a limitation of the present invention. In other embodiments, the control circuit 110 may be implemented by another type of switch such as a PMOS or a transmission gate, or the control circuit 110 may be arranged to selectively connect another reference voltage to any suitable node of the inductor L.

Figure 2:
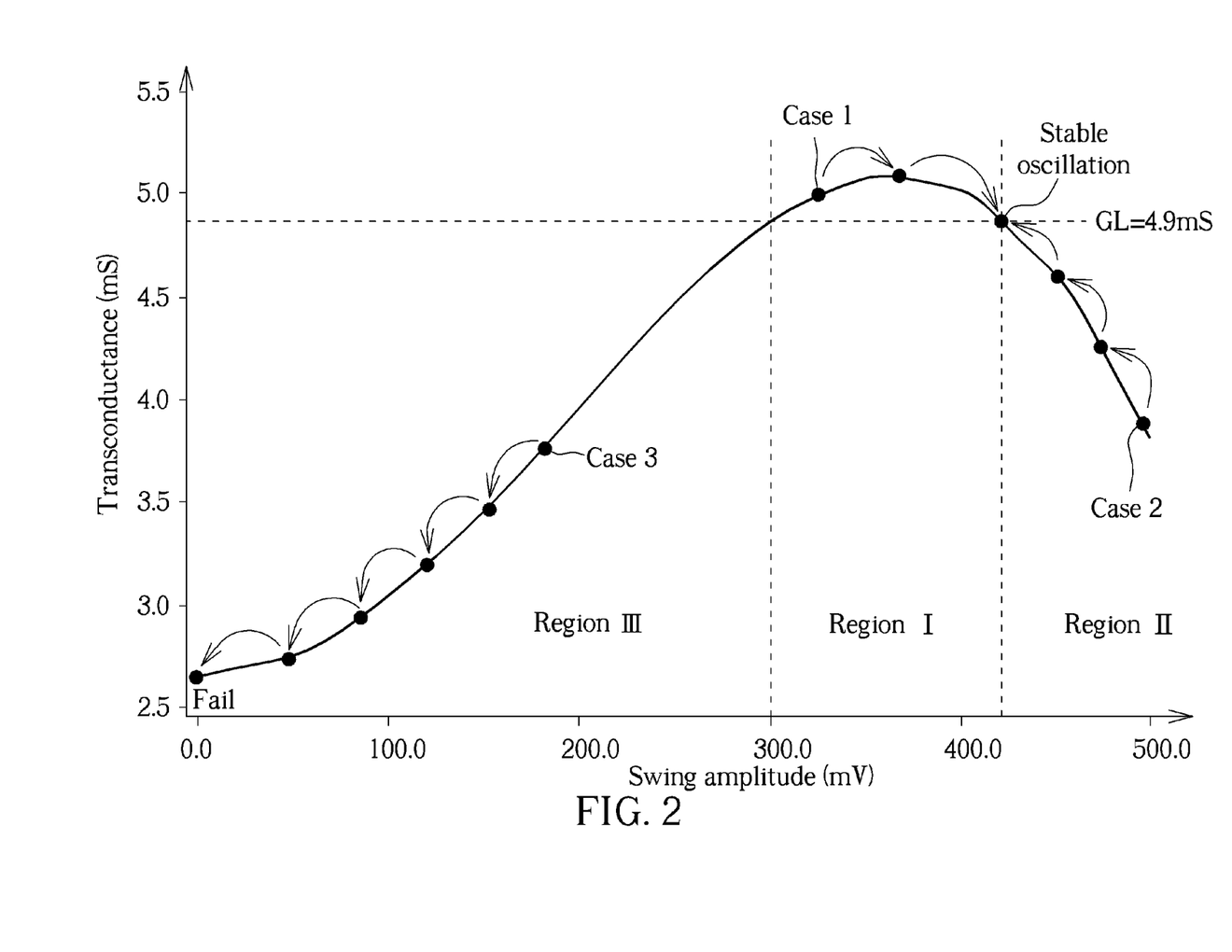
FIG. 2 is a diagram illustrating a relationship between a transconductance of the VCO and a swing amplitude of the oscillation signal when the control circuit is not used for start-up according to one embodiment of the present invention.

When the VCO 100 uses a low voltage application (e.g. the supply voltage VDD is equal to 1.15V) and is in the worst corner (e.g. the threshold voltages of the MP1, MP2, MN1 and MN2 are 0.6V), the VCO 100 may not generate the oscillation signals successfully. In detail, please refer to FIG. 2, which is a diagram illustrating a relationship between a transconductance of the VCO 100 and a swing amplitude of the oscillation signal VoutP/VoutN when the control circuit 110 is not used for start-up according to one embodiment of the present invention. In FIG. 2, because the inductor L and the capacitor C form a positive gain (e.g. gain loss GL=4.9 mili-Siemens (mS)), so the transconductance (gm) of the VCO 100 needs to continuously change until the transconductance is equal to the gain loss GL to obtain a stable oscillation. However, because the initial condition (e.g. common voltage and the initial swing) for start-up of the VCO 100 cannot be accurately controlled, so the initial condition may be in one of regions I-III shown in FIG. 2. If the initial condition is in the region I (case 1), because the transconductance (gm) of the VCO 100 is greater than the gain loss GL, so the swing amplitude of the oscillation signal VoutP/VoutN will increase until the transconductance (gm) of the VCO 100 is equal the gain loss GL, thereby obtaining the stable oscillation signals VoutP and VoutN. If the initial condition is in the region II (case 2), because the transconductance (gm) of the VCO 100 is less than the gain loss GL, so the swing amplitude of the oscillation signal VoutP/VoutN will decrease until the transconductance (gm) of the VCO 100 is equal the gain loss GL, thereby obtaining stable oscillation signals VoutP and VoutN. If the initial condition is in the region III (case 3), however, because the transconductance (gm) of the VCO 100 is less than the gain loss GL, so the swing amplitude of the oscillation signal VoutP/VoutN will decrease to zero, that is the VCO 100 fails to generate the oscillation signals VoutP and VoutN successfully.

To make the VCO 100 to always generate the stable oscillation signals even if the initial condition is in the region III, the embodiment shown in FIG. 1 provides a control method to use the control circuit 110 to control the VCO 100 to serve as a P-type VCO while in a start-up stage, and to control the VCO 100 to serve as the PN-type VCO while in a normal stage following the start-up stage.

Figure 3:
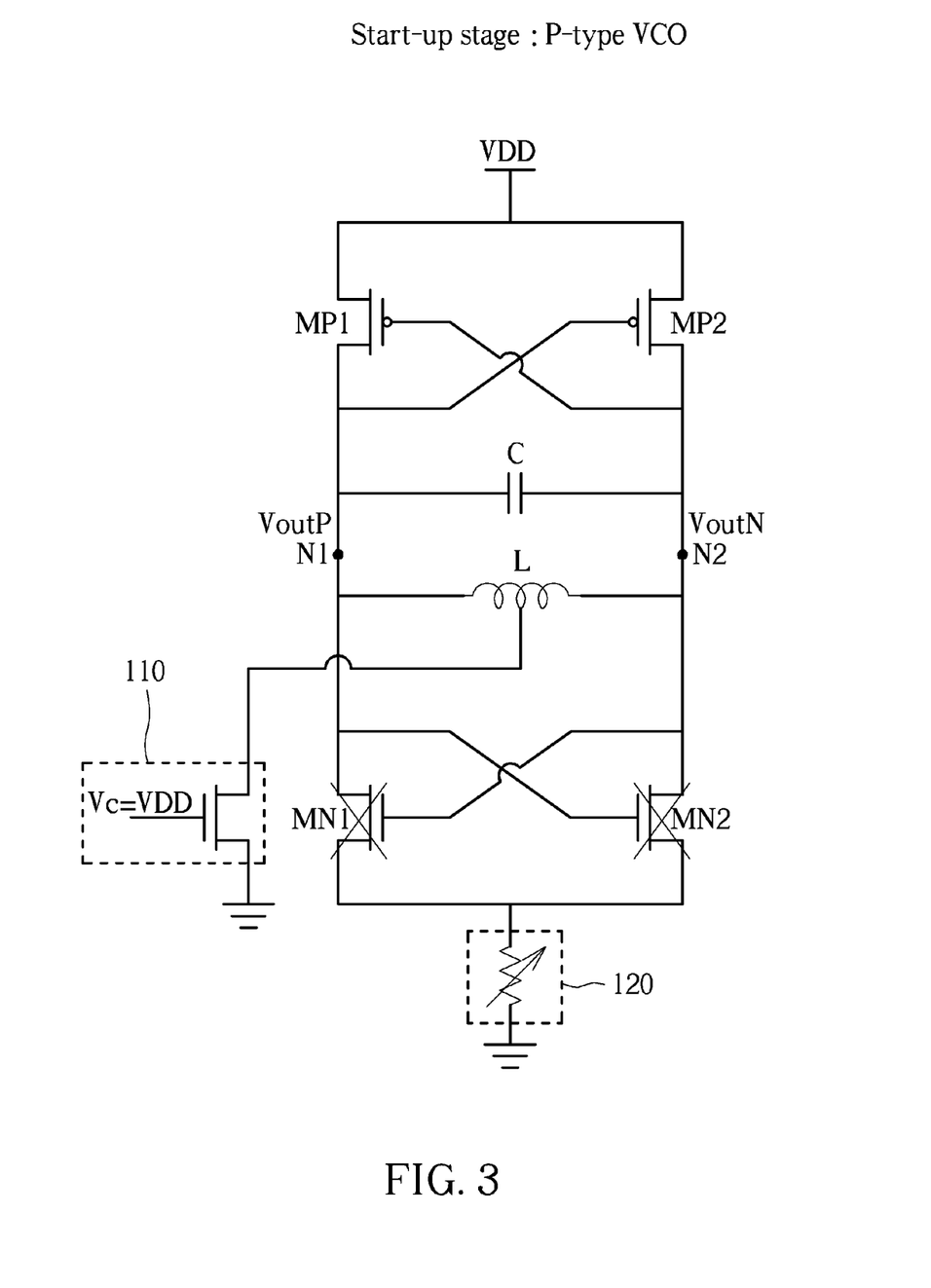
FIG. 3 is a diagram illustrating the VCO in a start-up stage according to one embodiment of the present invention.

In detail, please refer to FIG. 3, which is a diagram illustrating the VCO 100 in a start-up stage according to one embodiment of the present invention. When the VCO 100 starts to generate the oscillation signals VoutP and VoutN at the output terminals N1 and N2 (that is in the start-up stage), the control signal Vc is set to be a high voltage (e.g. the supply voltage VDD) to make the control circuit 110 to connect the ground voltage to the center tap of the inductor L. Because of the center tap of the inductor L is connected to the ground voltage, the output terminals N1 and N2 also have the ground voltage (DC voltage), thereby the NMOSs MN1 and MN2 are turned off. In addition, because the output terminals N1 and N2 have the ground voltage, gate-to-source voltage (Vgs) of the PMOSs MP1 and MP2 are largely increased, and the transconductance (gm) and the current flowing through each of the PMOSs MP1 and MP2 are also increased. Therefore, because of the increased transconductance (gm), the VCO 100 will not operate to have a curve within region III as shown in FIG. 2.

Figure 4:
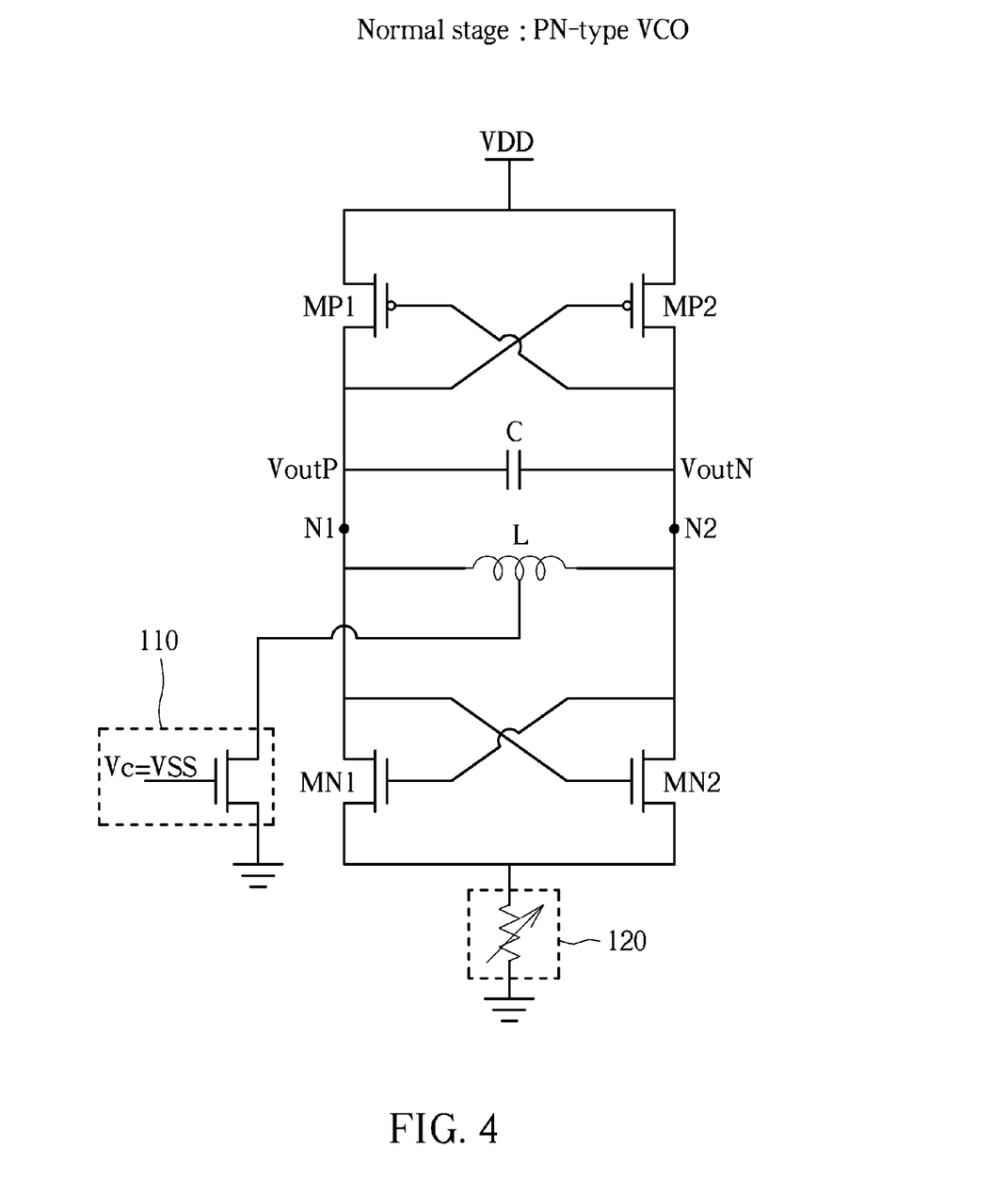
FIG. 4 is a diagram illustrating the VCO in the normal stage according to one embodiment of the present invention.

When the oscillation signals generated by the VCO 100 satisfy a startup requirement, for example, without limitation, the transconductance (gm) is equal to the gain loss, the VCO 100 switches to operate in the normal stage and serve as the PN-type VCO. Please refer to FIG. 4, which is a diagram illustrating the VCO 100 in the normal stage according to one embodiment of the present invention. In FIG. 4, the control signal Vc is set to be a low voltage (e.g. the ground voltage VSS) to make the control circuit 110 not to connect the ground voltage to the center tap of the inductor L. Because of the center tap of the inductor L is not connected to the ground voltage, so the NMOSs MN1 and MN2 are turned on. In addition, the gate-to-source voltages (Vgs) of the PMOSs MP1 and MP2 in the normal stage are less than the gate-to-source voltages of the PMOSs MP1 and MP2 in the start-up stage, so the transconductance (gm) and the current flowing through each of the PMOSs MP1 and MP2 are smaller in the normal stage.

Figure 5:
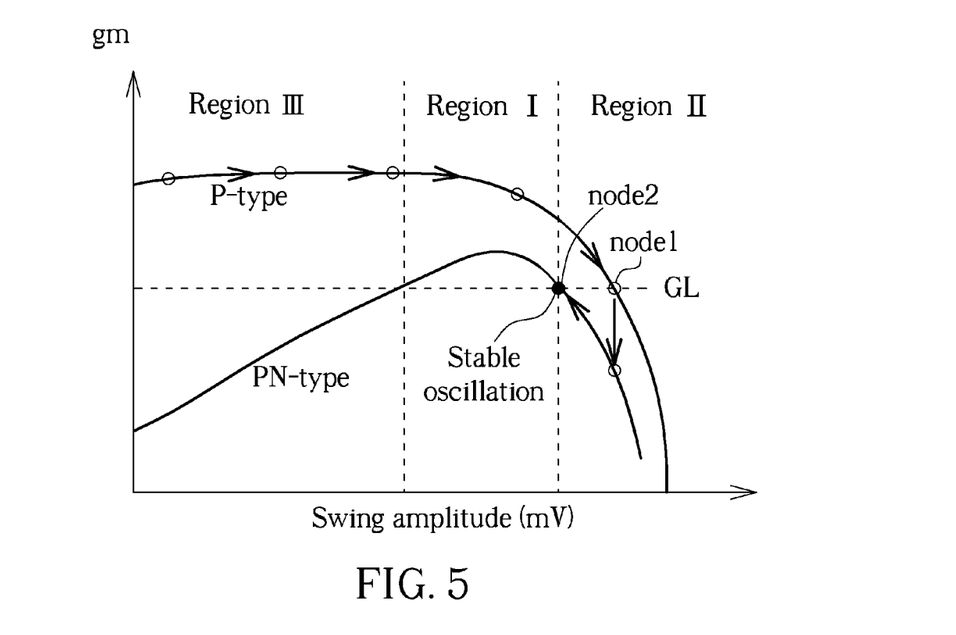
FIG. 5 is a diagram illustrating the relationship between the transconductance of the VCO and the swing amplitude of the oscillation signal when the VCO operates in the start-up stage and the following normal stage as shown in FIGS. 3-4 according to one embodiment of the present invention.

Please refer to FIG. 5, which is a diagram illustrating the relationship between the transconductance of the VCO 100 and the swing amplitude of the oscillation signal VoutP/VoutN when the VCO 100 operates in the start-up stage and the following normal stage as shown in FIGS. 3-4 according to one embodiment of the present invention. In FIG. 5, it is assumed that the initial condition is in the region III. As shown in FIG. 5, the VCO 100 operates as the P-type VCO with larger transconductance (gm) in the start-up stage, and because the transconductance (gm) of the P-type VCO is greater than the gain loss GL at region I and III, so there is no startup issue and the swing is determined where gm equals to gain loss GL, that is, node1. Then, the VCO 100 switches to operate as the PN-type VCO to save power, and because the transconductance (gm) of the PN-type VCO is less than the gain loss GL, so the swing amplitude of the oscillation signal VoutP/VoutN is decreased until the transconductance (gm) of the VCO 100 is equal the gain loss GL, that is, node2. Thereby the stable oscillation signals VoutP and VoutN are obtained.

Figure 6:
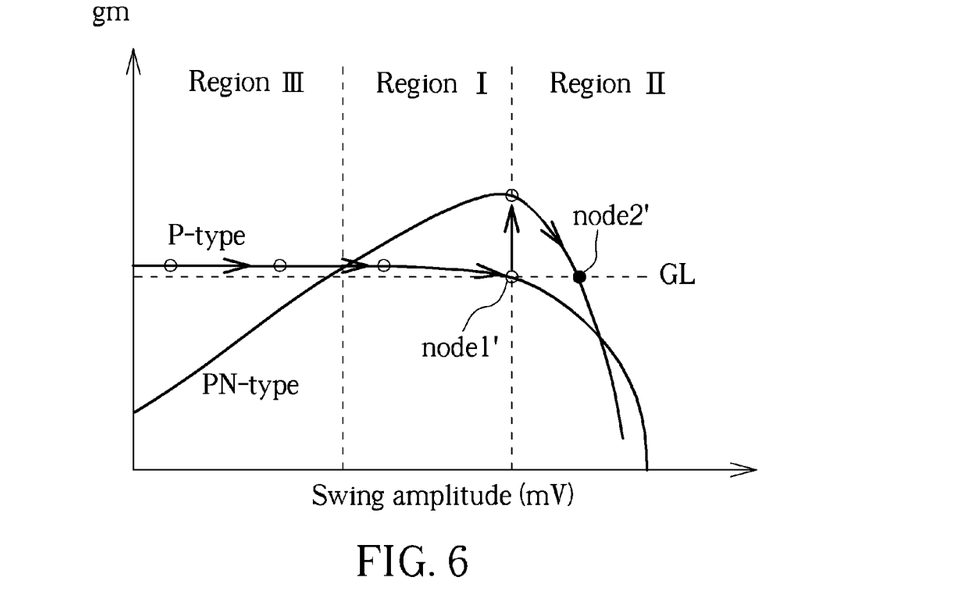
FIG. 6 is a diagram illustrating the relationship between the transconductance of the VCO and the swing amplitude of the oscillation signal when the VCO operates in the start-up stage and the following normal stage as shown in FIGS. 3-4 according to another embodiment of the present invention.

Please refer to FIG. 6, which is a diagram illustrating another relationship between the transconductance of the VCO 100 and the swing amplitude of the oscillation signal VoutP/VoutN when the VCO 100 operates in the start-up stage and the following normal stage as shown in FIGS. 3-4 according to another embodiment of the present invention. In FIG. 6, it is assumed that the initial condition is in the region III. As shown in FIG. 6, the VCO 100 operates as the P-type VCO with larger transconductance (gm) in the start-up stage, and because the transconductance (gm) of the P-type VCO is greater than the gain loss GL, so the swing amplitude of the oscillation signal VoutP/VoutN is increased to enter into the region II and the swing is determined as node1'. Then, the VCO 100 switches to operate as the PN-type VCO to save power, and because the transconductance (gm) of the PN-type VCO is also greater than the gain loss GL, so the swing amplitude of the oscillation signal VoutP/VoutN is increased until the transconductance (gm) of the VCO 100 is equal the gain loss GL, that is, node2'. Thereby the stable oscillation signals VoutP and VoutN are obtained.

In light of above, the VCO 100 operates as the P-type VCO to make sure that the transconductance (gm) is greater than the gain loss GL in the start-up stage (region III), therefore, the swing amplitude of the oscillation signal VoutP/VoutN can be guaranteed to be in the region II or the region I while switching into the normal stage (i.e. the VCO 100 operates as the PN-type VCO). By using the above-mentioned control method, the VCO 100 can be guaranteed to generate the oscillation signals VoutP and VoutN successfully even if the VCO 100 is in the worst case (e.g. worst corner and the initial condition is in the region III).

Figure 7:
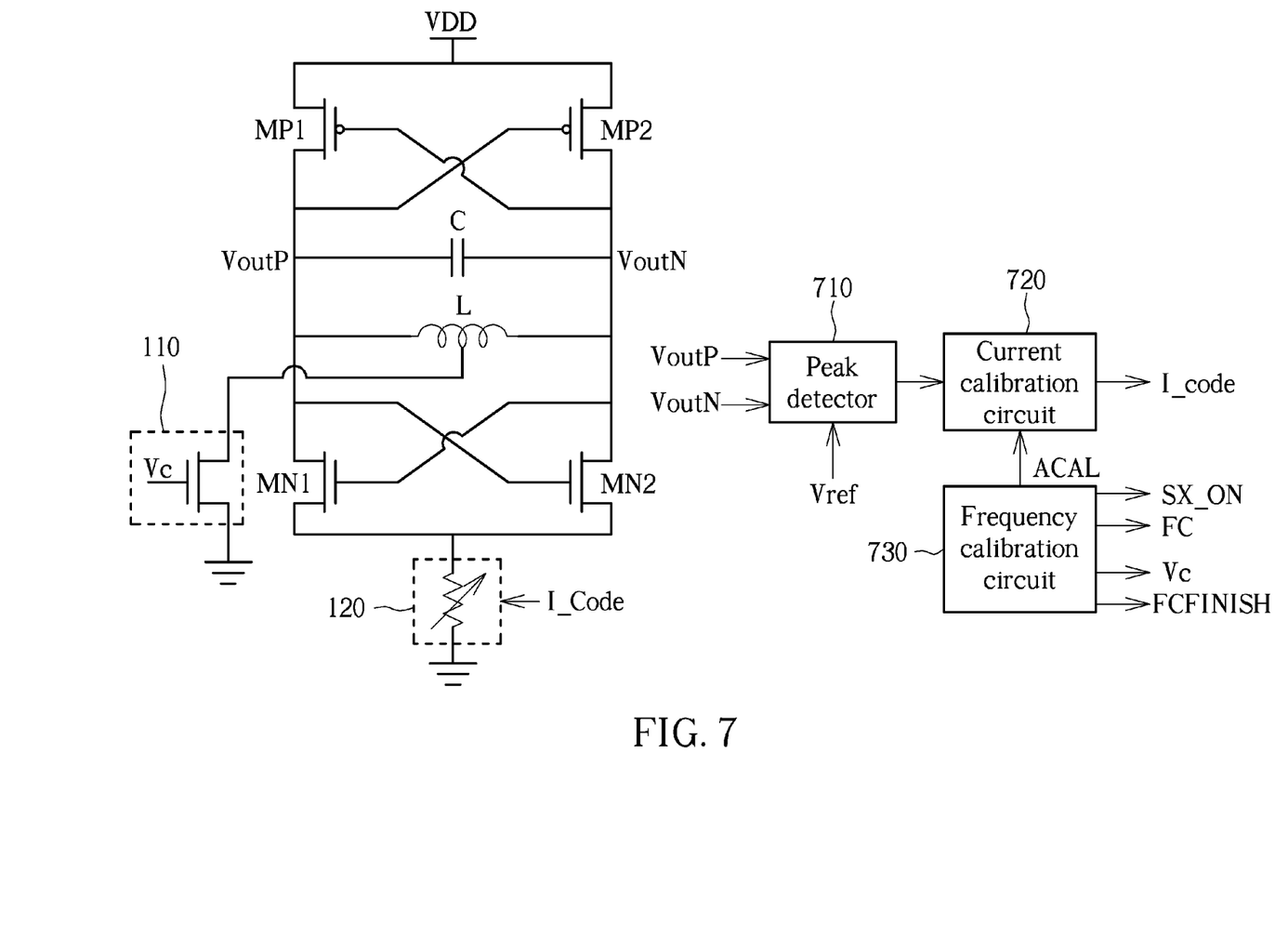
FIG. 7 is a diagram illustrating a calibration circuit according to one embodiment of the present invention.
Figure 8:
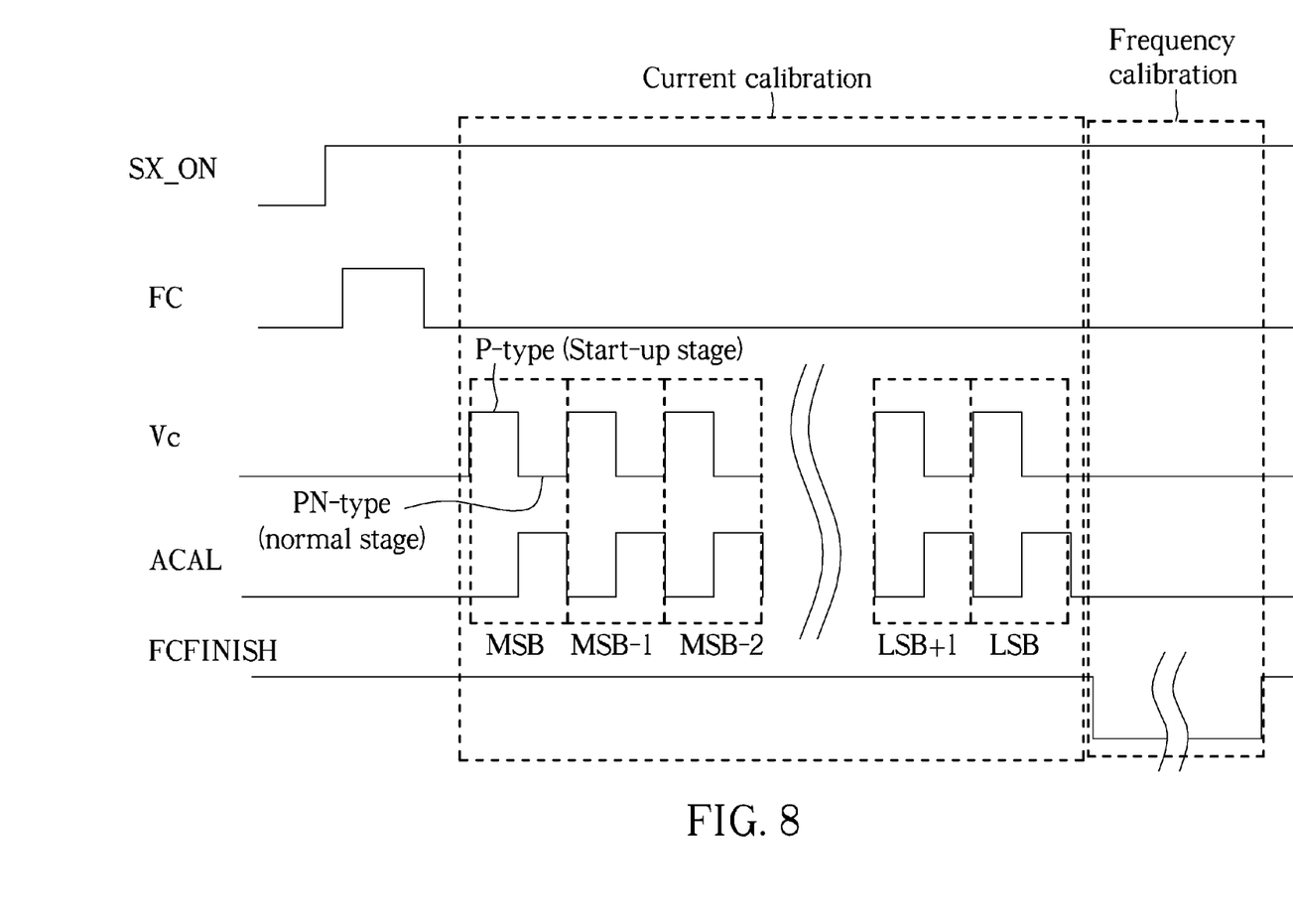
FIG. 8 is a timing diagram of signals of the calibration circuit according to one embodiment of the present invention.

In addition, in order to further decrease the power consumption, the variable current source 120 can be controlled to have a minimum current capable of generating the oscillation signals VoutP and VoutN. Regarding the determination of the minimum current provided by the variable current source 120, please refer to FIG. 7 and FIG. 8, where FIG. 7 is a diagram illustrating a calibration circuit according to one embodiment of the present invention, and FIG. 8 is a timing diagram of signals of the calibration circuit according to one embodiment of the present invention. As shown in FIG. 7, the calibration circuit comprises a peak detector 710, a current calibration circuit 720 and a frequency calibration circuit 730, where the peak detector 710 is used to compare the output oscillation signals VoutP and VoutN with a reference voltage Vref to generate a comparison result; the frequency calibration circuit 730 is used to generate an enable signal SX_ON to start to generate the oscillation signals VoutP and VoutN, the frequency calibration signal FC, the control signal Vc, an current calibration signal ACAL and a frequency calibration finish signal FCFINISH; the current calibration circuit 720 is used to generate a digital control code I_code according to the current calibration signal ACAL and an output of the peak detector 710.

In FIG. 8, the frequency control circuit 730 may generate the control signal Vc to turn on and off the control circuit 110 alternately, and the current calibration circuit 720 generates each bit of the digital control code I_code to control the current provided by the variable current source 120. In detail, when the VCO 100 operates in the first normal stage following the first start-up stage, the current calibration circuit 720 generates a most significant bit (MSB) of the digital control code I_code to the variable current source 120, and the peak detector 710 detects whether the output oscillation signals VoutP and VoutN is greater than the reference voltage Vref (i.e. whether the VCO 100 can oscillate successfully) to generate the comparison result to the current calibration circuit 720. Then, when the VCO 100 operates in the second normal stage following the second start-up stage, the current calibration circuit 720 generates a second most significant bit (MSB-1) of the digital control code I_code to the variable current source 120, and the peak detector 710 detects whether the output oscillation signals VoutP and VoutN is greater than the reference voltage Vref to generate the comparison result to the current calibration circuit 720. By performing the above current calibrations during each normal stage of the VCO 100, all bits of the digital control code I_code for generating a target current (i.e. the minimum current) can be obtained.

After the current calibration is finished, the VCO 100 starts the process the frequency calibration. Because the present invention does not focus on the frequency calibration, so the related descriptions are omitted here.

Briefly summarized, in the embodiments of the VCO and the control method of the present invention, the VCO operates as the P-type VCO to make sure that the VCO can generate the oscillation signals successfully, then the VCO switches to operate in the PN-type VCO to save power. Therefore, the VCO of the embodiments can function well with lower power consumption.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage-controlled oscillator for generating oscillation signals at two output terminals, comprising:
   an inductor coupled between the two output terminals;
   a capacitor coupled between the two output terminals;
   two P-type transistors, coupled between a supply voltage and the two output terminals;
   two N-type transistors, coupled between a ground voltage and the two output terminals; and
   a control circuit, coupled to the inductor, for controlling a current flowing through the two P-type transistors and the inductor;
   wherein when the voltage-controlled oscillator generates the oscillation signals, each P-type transistor is controlled to have different currents by setting different DC voltages at the corresponding output terminal.

2. The voltage-controlled oscillator of claim 1, wherein the control circuit controls the DC voltages of the two output terminals by setting a voltage of a center tap of the inductor or not.

3. The voltage-controlled oscillator of claim 2, wherein the control circuit controls the DC voltages of the two output terminals by connecting the center tap of the inductor to the ground voltage or not.

4. The voltage-controlled oscillator of claim 1, wherein the control circuit is implemented by a switch, and is selectively coupling the ground voltage to the inductor or not.

5. The voltage-controlled oscillator of claim 1, wherein when the control circuit controls the DC voltages of the two output terminals to have a specific voltage level, the two N-type transistors are turned off; and when the control circuit controls the DC voltages of the two output terminals to not have the specific voltage level, the two N-type transistors are turned on.

6. The voltage-controlled oscillator of claim 5, wherein when the voltage-controlled oscillator is in a start-up stage, the control circuit controls the DC voltages of the two output terminals to have the ground voltage, and the two N-type transistors are turned off; and when the voltage-controlled oscillator is in a normal stage following the start-up stage, the control circuit does not control the DC voltages of the two output terminals, and the two N-type transistors are turned on; and the current flowing through the P-type transistors in the start-up stage is greater than the current in the normal mode.

7. The voltage-controlled oscillator of claim 6, further comprising:
   a variable current source, coupled between the two N-type transistors and the ground voltage; and a calibration circuit, coupled to the variable current source, for controlling a current of the variable current source;

wherein the voltage-controlled oscillator operates in the start-up stage and the normal stage alternately, and the calibration circuit calibrates the current provided by the variable current source during a plurality of normal stages to determine a target current of the variable current source.

8. A voltage-controlled oscillator for generating oscillation signals at two output terminals, comprising:

an inductor coupled between the two output terminals;

a capacitor coupled between the two output terminals;

two P-type transistors, coupled between a supply voltage and the two output terminals;

two N-type transistors, coupled between a ground voltage and the two output terminals, wherein drain electrodes of the two N-type transistors are coupled to drain electrodes of the two P-type transistors via the two output terminals, respectively; and a control circuit, coupled to the inductor, for turning on or off the two N-type transistors.

9. The voltage-controlled oscillator of claim 8, wherein the control circuit controls the voltage of a center tap of the inductor to turn on or off the two N-type transistors.

10. The voltage-controlled oscillator of claim 8, wherein the control circuit is implemented by a switch, and is selectively coupling the ground voltage to the inductor or not.

11. The voltage-controlled oscillator of claim 8, wherein when the control circuit turns off the two N-type transistors by controlling the two output terminals to have a specific voltage level; and control circuit turns on the two N-type transistors by controlling the two output terminals to not have the specific voltage level.

12. The voltage-controlled oscillator of claim 11, wherein when the voltage-controlled oscillator is in a start-up stage, the control circuit controls the two output terminals to have the ground voltage to turn off the two N-type transistors; and when the voltage-controlled oscillator is in a normal stage following the start-up stage, the control circuit does not control the two output terminals to turn on the two N-type transistors.

13. The voltage-controlled oscillator of claim 12, further comprising:

a variable current source, coupled between the two N-type transistors and the ground voltage; and a calibration circuit, coupled to the variable current source, for controlling a current of the variable current source;

wherein the voltage-controlled oscillator operates in the start-up stage and the normal stage alternately, and the calibration circuit calibrates the current provided by the variable current source during a plurality of normal stages to determine a target current of the variable current source.

14. A method for controlling a voltage controlled oscillator, comprising:

when the voltage controlled oscillator is in a start-up stage, controlling the voltage controlled oscillator to operate as a P-type voltage controlled oscillator; and when the voltage controlled oscillator is in a normal stage following the start-up stage, controlling the voltage controlled oscillator to operate as a PN-type voltage controlled oscillator;

wherein the voltage controlled oscillator comprises an inductor, a capacitor, two P-type transistors and two N-type transistors, and the step of controlling the voltage controlled oscillator to operate as the P-type voltage controlled oscillator or the PN-type voltage-controlled oscillator comprises:

when the voltage controlled oscillator is in the start-up stage, turning off the two N-type transistors to make the voltage controlled oscillator to operate as the P-type voltage controlled oscillator; and when the voltage controlled oscillator is in the normal stage following the start-up stage, turning on the N-type transistors to make the voltage controlled oscillator to operate as the PN-type voltage controlled oscillator.

15. The method of claim 14, wherein the step of controlling the voltage controlled oscillator to operate as the P-type voltage controlled oscillator or the PN-type voltage controlled oscillator comprises:

when the voltage controlled oscillator is in the start-up stage, controlling the two P-type transistors to have a first current; and when the voltage controlled oscillator is in the normal stage following the start-up stage, controlling the two P-type transistors to have a second current;

wherein the first current is greater than the second current.

16. The method of claim 14, wherein the step of controlling the voltage controlled oscillator to operate as the P-type voltage controlled oscillator or the PN-type voltage controlled oscillator comprises:

when the voltage controlled oscillator is in the start-up stage, setting the inductor to have a specific voltage; and when the voltage-controlled oscillator is in the normal stage following the start-up stage, not setting the inductor to have the specific voltage.

17. The method of claim 16, wherein the step of setting the inductor to have the specific voltage comprises:

connecting a ground voltage to the inductor via a switch.

18. The method of claim 14, wherein the voltage controlled oscillator further comprises a variable current source, and the method further comprising:

controlling the voltage controlled oscillator to operate in the start-up stage and the normal stage alternately; and calibrating a current provided by the variable current source during a plurality of normal stages to determine a target current of the variable current source.

* * * * *